United States Patent
Van Acht et al.

(10) Patent No.: US 7,952,949 B2
(45) Date of Patent: May 31, 2011

(54) ELECTRONIC CIRCUIT THAT COMPRISES A MEMORY MATRIX AND METHOD OF READING FOR BITLINE NOISE COMPENSATION

(75) Inventors: Victor M. G. Van Acht, Waalre (NL); Nicolaas Lambert, Waalre (NL)

(73) Assignee: NXP B.V., Eindhoven (NL)

( * ) Notice: Subject to any disclaimer, the term of this patent is extended or adjusted under 35 U.S.C. 154(b) by 492 days.

(21) Appl. No.: 12/293,817

(22) PCT Filed: Mar. 27, 2007

(86) PCT No.: PCT/IB2007/051065
§ 371 (c)(1),
(2), (4) Date: Sep. 20, 2008

(87) PCT Pub. No.: WO2007/113731
PCT Pub. Date: Oct. 11, 2007

(65) Prior Publication Data
US 2010/0232245 A1 Sep. 16, 2010

(30) Foreign Application Priority Data

Mar. 30, 2006 (EP) .................................... 06111964

(51) Int. Cl.
*G11C 7/04* (2006.01)
(52) U.S. Cl. .................. 365/210.11; 365/206; 365/207; 365/185.2
(58) Field of Classification Search ............. 365/210.11, 365/206, 207, 185.2
See application file for complete search history.

(56) References Cited

U.S. PATENT DOCUMENTS

| | | | |
|---|---|---|---|
| 5,010,524 A * | 4/1991 | Fifield et al. ................. | 365/206 |
| 5,014,241 A | 5/1991 | Asakura et al. | |
| 5,140,556 A | 8/1992 | Cho et al. | |
| 6,462,998 B1 * | 10/2002 | Proebsting .................... | 365/205 |
| 6,639,846 B2 | 10/2003 | Nikutta | |

FOREIGN PATENT DOCUMENTS

| DE | 10116325 A1 | 10/2002 |
|---|---|---|
| EP | 0205294 A2 | 12/1986 |

OTHER PUBLICATIONS

Gulati K et al; "Single Event Mirroring and DRAM Sense Amplifier Designs for Improved Single-Event Upset Performance". IEEE Transactions on Nuclear Science, vol. 41, No. 6, pp. 2026-2034, Dec. 1994. IEEE, Piscataway, NJ, USA.
Zaid Al-Ars et al, "Effects of Bitline coupling on the faulty Behaviour of DRAMs", IEEE VLSI test symposium, 2004, see whole document [20040101AlArsZaid].
J.S. Yuan et al, "Parasitic Effects on the Multilevel Interconnects in DRAM Circuits", IEEE, 1990, see whole document [19900101YuanJS].

* cited by examiner

*Primary Examiner* — Tuan T. Nguyen

(57) ABSTRACT

Data is read from a memory matrix (10) with a plurality of bit lines (12). A differential sense amplifier (14) receives a signal derived from a first one of the bit lines (12) on a first input. The differential sense amplifier (14) receives a reference signal from a reference output of a reference circuit (15) to a second input. A second one of the bit lines (12), which is adjacent to the first one of the bit lines (12), is coupled to the reference circuit (15), so that a bit line signal value on the second one of the bit lines (12) affects a reference signal value on the reference output, at least partly reproducing an effect of crosstalk of the bit line signal value (12) on the second one of the bit lines (12) on a bit line signal value on the first one of the bit lines (12).

10 Claims, 3 Drawing Sheets

ELECTRONIC CIRCUIT THAT COMPRISES A MEMORY MATRIX AND METHOD OF READING FOR BITLINE NOISE COMPENSATION

The invention relates to an electronic circuit that comprises a memory matrix.

Crosstalk between signals on neighboring bit lines of a memory matrix is an increasing problem as the distance between the bit lines comes down. U.S. Pat. No. 6,639,846 describes a solution to this problem that involves grounding of bit-lines on either side of a bit line from which data is sensed. Thus, crosstalk from further bit lines is shielded. However, this reduces the number of bit lines that can be read in parallel. Moreover, perfect shielding is impossible.

Another solution is mentioned in an article titled "Single Event Mirroring and DRAM Sense Amplifier Designs for Improved Single-Event Upset Performance", by Kush Gulati, Lloyd W. Massengil and Ghasi R. Agrawal, published in the IEEE Transactions on Nuclear Science Vol 41, pages 2026-2034 in December 1994. This article describes a technique that uses a differential sense amplifier with inputs coupled to a bit line and a reference bit line coupled to a reference memory cell. The article proposes to connect the bit line to the reference line prior to sensing. This is done using capacitive coupling between the bit line and the reference line during part of the sensing process or via a filter with a suitable filter characteristic that passes unwanted fluctuations to the reference line. The article mentions that this can be used to reduce inter bit-line coupling noise. However, this solution works only partly, because either a complex filter is needed to ensure that the relevant response on the bit line is not passed to the reference line, or the coupling can be used only part of the time when no relevant response develops.

Among others, it is an object of the invention to provide for an electronic circuit with a memory, wherein the effect of crosstalk between bit lines on sense amplifier results is reduced.

An electronic circuit according to claim 1 is provided. Herein a signal derived from a first bit line is applied to a first input of a differential sense amplifier via a coupling circuit that may simply consist of connecting conductors or comprise switches, multiplexers etc. A signal derived from a reference circuit is supplied to a second input of the differential sense amplifier. A second bit line, which is coupled to memory cells in a column adjacent to the first bit line, is coupled to the reference circuit via a cross-coupling circuit that may simply consist of connecting conductors or comprise switches, multiplexers etc, so that bit line signal value on the second the bit line affects a reference signal value on the reference output. The size of the coupling is selected to that the effect on the reference signal at least partly reproduces a cross-talk effect of the second bit line on the first bit line. Thus, the effect of cross-talk on sensing is reduced. Preferably a plurality of such combinations of a sense amplifiers and a reference circuit is provided for a memory matrix, to sense different bit lines in parallel.

In an embodiment the cross-coupling circuit is configured to couple adjacent bit lines from both sides of the first bit line to the reference circuit. Thus, the effect of cross-talk from both sides on sensing is reduced. In another embodiment also a non-adjacent bit line is coupled to the reference circuit to reduce a dependence on signal values on that bit line.

This form of reference signal adaptation is especially advantageous for memories with memory cells that store analog values that represent n-ary (n>2) digital values. In this way better resolution between the different values is possible. This may applied for example to non-volatile memories such as flash memories.

These and other objects and advantageous aspects will become apparent from the following description of exemplary embodiments, with reference to the accompanying figures.

Figure 1:
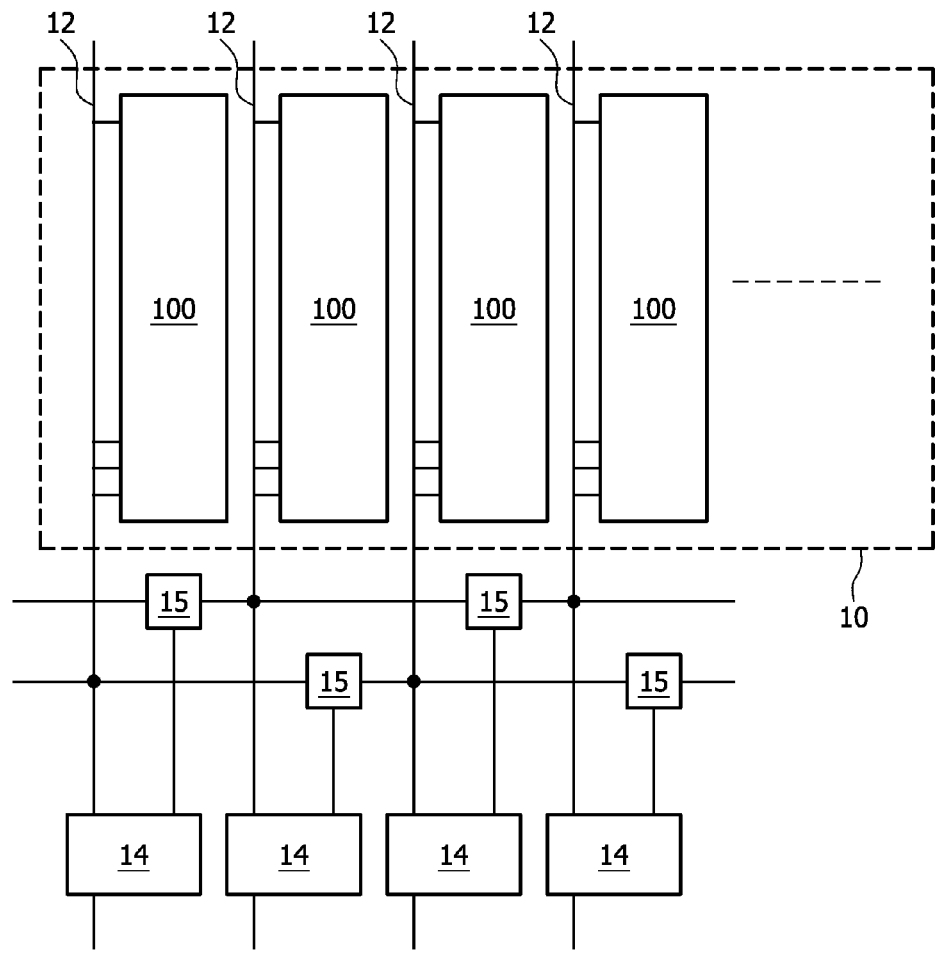
FIG. 1 shows part of an electronic circuit with a memory matrix

FIG. 1 shows an electronic circuit with a memory matrix 10 that comprises a plurality of columns 100 of memory cells. For each column 100 the circuit comprises a respective bit line 12, a differential sense amplifier 14 and a reference circuit 15. For each column 100 the bit line 12 for a column 100 is a conductor coupled to the memory cells in the column 100. For each column 100 the differential sense amplifier 14 for the column 100 has a first input coupled to the bit line 12 for the column 100 and a second input coupled to an output of the reference circuit 15 for the column 100. For each column 100 the inputs of the reference circuit 15 for the column 100 are coupled to the bit lines 12 for the adjacent columns 100 (or column in the case of columns at the edges of the matrix).

Figure 1A:
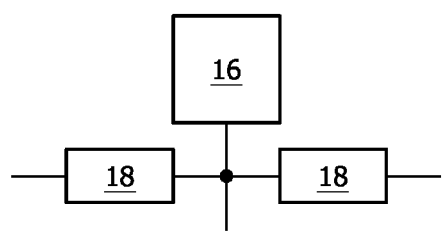
FIG. 1a shows reference circuit

FIG. 1a shows an embodiment of a reference circuit 15 comprising a core reference circuit 16, which is independent of signals on bit lines and resistive elements 18 coupling the output of the core reference circuit 16 to adjacent bit lines (not shown). It should be appreciated that this reference circuit is only one embodiment. In other embodiments, more separate core reference circuit needs to be provided.

In operation a row of memory cells in respective columns is selected in parallel by a row addressing circuit (not shown). The memory cells of the selected row are enabled to affect signal changes on the bit lines 12 of the respective columns. Differential sense amplifiers 14 amplify a difference between the resulting signals on the bit lines 12 at the first inputs and signals from the outputs of the reference circuits 15. Output signals of differential sense amplifiers 14 are supplied to further circuits (not shown), the differential sense amplifiers 14 and/or the further circuits producing digital signals. In one embodiment each output signal is converted into a binary signal (having one of two possible values), but in another embodiment each output signal is converted into an n-ary signal (with n>3) by comparing the signal to more than one different threshold. This may be implemented in various ways. In one embodiment, a detection circuit comprises one differential sense amplifier 14 and one reference circuit 15. In this embodiment reference circuit 15 is switched to supply a series of successive reference signals successively, each to distinguish between pairs of successive signal ranges that correspond to different ones of the n values. In this embodiment, each successive reference signal is changed by allowing signal variations from an adjacent bit line to affect the reference signal.

Figure 2:
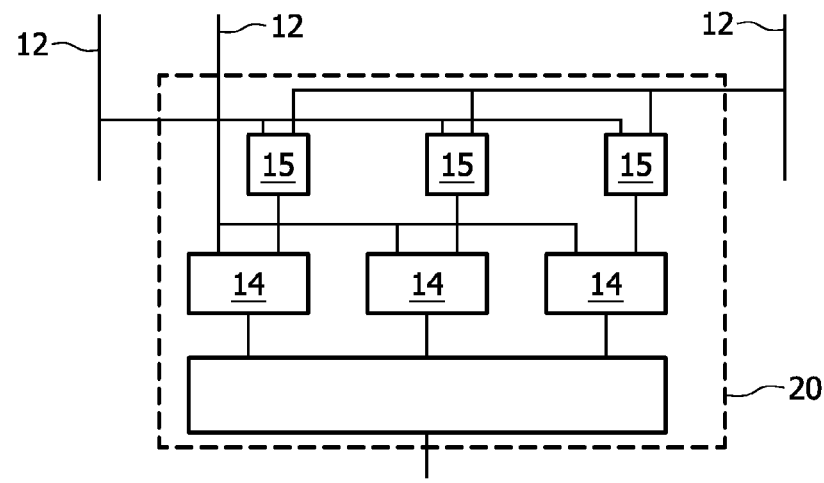
FIG. 2 shows detection circuit

FIG. 2 shows another embodiment wherein a detector 20 with a plurality of differential sensing circuits 14 and reference circuits 15 is provided in parallel for a bit line 12. In this embodiment each reference circuit 15 supplies a respective one of the reference signals and each reference signal is changed by allowing signal variations from adjacent bit lines 12 to affect the reference signal. The outputs of the sense amplifiers are fed to a decoding circuit that derives a digital signal from the output signals of the sense amplifiers. In another embodiment One reference circuit may be used to produce different reference signals with predetermined offsets to one another. This technique may be applied for example to memories with non-volatile memory cells, such as flash memories.

Not shown in the figure are intrinsic coupling capacitances between adjacent columns 100, which are due to electric fields from one bit line to the next. These intrinsic capacitances result in crosstalk, with the effect that signal changes on the bit lines 12 cause cross-coupled signal changes in the adjacent bit-lines 12 in addition to the signal changes due to the memory cells that are directly coupled to the bit lines 12.

Reference circuits 15 provide for the generation of signal changes on the output of the core reference circuit 16 in response to the signal changes on the bit lines 12 for the adjacent columns 100, with a size that is the same as the effect of crosstalk between adjacent bit lines 12. In the embodiment of FIG. 1a resistive elements 18 effect the signal changes on the output of the core reference circuit 16 in response to the signal changes on the bit lines 12 for the adjacent columns 100. The resistance values of the resistive elements 18 are selected so that the induced signal changes having a size equal to that of the cross-coupled signal changes on the bit line 12 of the column 100. The specific value depends on the geometry of the matrix.

Figure 3:
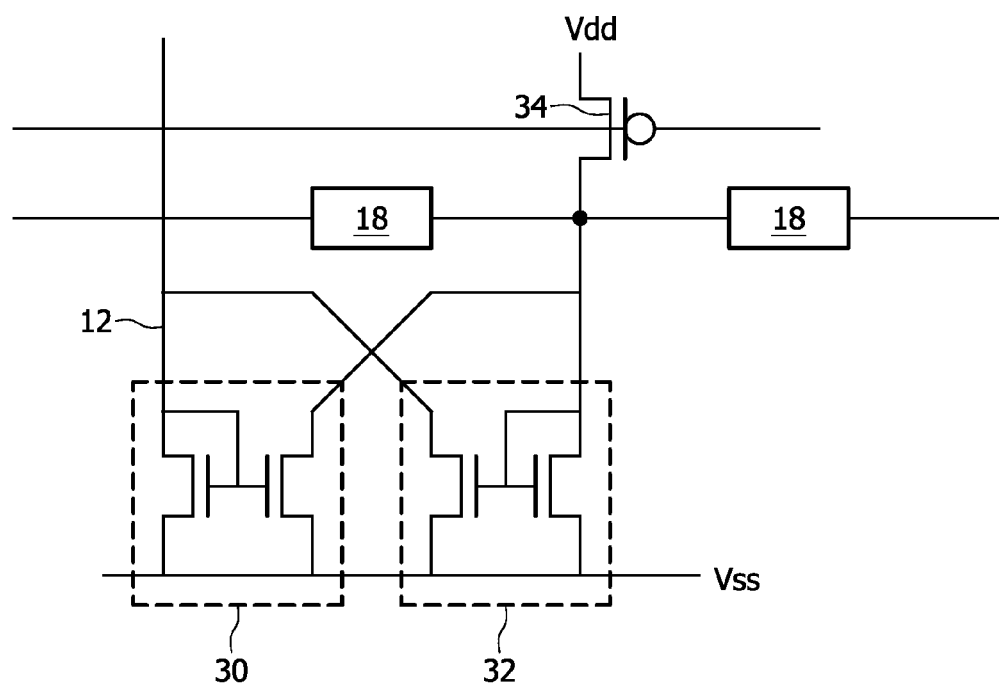
FIG. 3 shows a an embodiment of a sense amplifier and a reference circuit

FIG. 3 shows an example of an embodiment of the differential sense amplifier and reference circuit. In this embodiment the differential sense amplifier comprises a pair of cross-coupled current mirrors 30, 32. A first current mirror 30 has an input coupled to the bit line 12 and the output of a second current mirror 32. The reference circuit is formed by a reference transistor 34 with a channel coupled between a power supply connection Vdd and an input of the second current mirror 32, which is coupled to the output of the first current mirror 30. The gates of the reference transistors 34 for different columns are coupled to each other and to a reference voltage source (not shown). In an embodiment the reference voltage source supplies a constant reference voltage. In another embodiment the reference voltage source may supply a selectable reference voltage. In this embodiment resistive elements 18 add a variable amount of current to the current from reference transistor 34, dependent on variations of voltages on adjacent bit lines.

It should be appreciated that FIG. 3 shows only one embodiment of a differential sense amplifier and reference source. In other embodiments a resistive element coupled to power supply connection Vdd may be used instead of reference transistor 34 for example. Similarly, instead of cross coupled current mirrors a long tailed pair type of differential amplifier may be used or cross-coupled voltage amplifiers etc.

Similarly, it should be appreciated that instead of cross-coupling by resistive elements 18 cross-coupling by other elements may be used, such as capacitances. Resistive elements 18 may be implemented as resistors (e.g. regions of resistive material in an integrated circuit) or as channels of transistors. As another alternative coupling transistors may be used that have their gates coupled to the adjacent bit lines and their channels coupled between the output of the reference circuit and a reference source.

As a further alternative a more complicated reference circuit may be used, wherein the coupling lines from adjacent bit lines 12 are not simply coupled to the output of the reference circuit but to inputs of this reference circuit. The reference circuit responding to signal variations at these inputs by adding signal variations to the reference signal at its outputs. In yet another embodiment the reference circuit may be integrated wholly or partly with the differential sense amplifiers 14.

In each type of embodiment, the coupling elements or the response behavior to signals from the adjacent bit lines are preferably designed to provide a coupling strength that induces signal variations on the reference input of the differential sense amplifier that are of equal size with variations induced on a bit line 12 by adjacent bit lines. However, it will be appreciated that an improvement of sensing is realized even if the coupling differs from this ideal coupling strength so that the compensation is not perfect. A reduction of differential cross-coupling at the inputs of the differential sense amplifier occurs as long as the induced signal variations on the reference input have a size less than twice the variations induced by the adjacent bit lines on the signal input of the differential sense amplifier. Similarly, although it is preferred to couple adjacent bit lines for columns 100 on either side of a column to the reference circuit for that column, it should be understood that in an embodiment a reduction of cross-talk effects on the differential sense amplifier may already be realized by coupling an adjacent bit line only from one side to the reference circuit.

Figure 4:
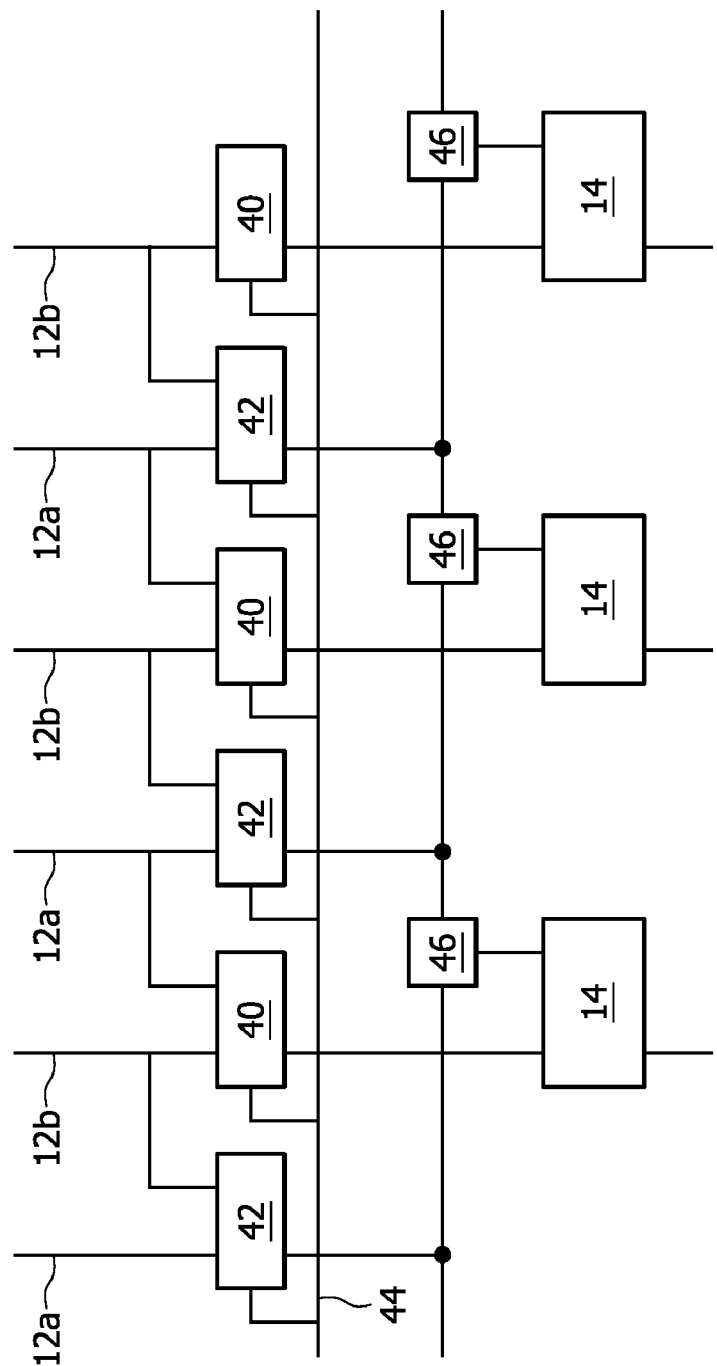
FIG. 4 shows part of an electronic circuit

Although an embodiment has been shown with a fixed coupling of bit lines to outputs of reference circuits, it should be appreciated that a switched coupling can be used as well. FIG. 4 illustrates an example of an embodiment wherein sense amplifiers 14 and reference circuits 46 are multiplexed between bit lines. Reference circuit 46 may comprise a bit line independent reference circuit with an output and resistive elements coupled to the outputs, as shown in FIG. 1, or alternatively some other circuit with inputs for receiving signals from other bit lines to affect the reference signal.

The bit lines are indicated alternately as even numbered bit lines 12a and odd numbered bit lines 12b. First multiplexing circuits 40 are provided for coupling bit lines 12a,b to the signal input of differential sense amplifiers 14. Second multiplexing circuits 42 are provided for coupling bit lines 12a,b to reference circuits 46. Each time an even numbered bit line 12a and its left neighboring odd numbered bit line 12b are coupled to a first multiplexing circuit 40 and an even numbered bit line 12a and its right neighboring odd numbered bit line 12b are coupled to a second multiplexing circuit 42. The outputs of the first multiplexing circuits 40 are coupled to signal inputs of corresponding differential sense amplifiers 14. The outputs of the second multiplexing circuits 42 are coupled to pairs of reference circuits 46.

A control line 44 is provided for switching the first and second multiplexing circuits 40, 42 between an even mode and an odd mode (although a single control line 44 is shown, in practice a pair of control lines carrying mutually opposite control signals may be used). In the even mode the first multiplexing circuits 40 couple even numbered bit lines 12a to the reference input of differential sense amplifiers 14 and the second multiplexing circuits 42 couple odd numbered bit lines 12b to nodes that are coupled to the reference circuits 46 for differential sense amplifiers 14 that are coupled to adjacent even numbered bit lines 12a. In the odd mode the first and second multiplexing circuits 40 couple odd numbered bit lines 12b to the reference input of differential sense amplifiers 14 and the second multiplexing circuits 42 couple even numbered bit lines 12a to nodes that are coupled to the reference circuits 46 for differential sense amplifiers 14 that are coupled to adjacent odd numbered bit lines 12b.

In this way, multiplexing circuits 40, 42 provide for combined shifting of the connections of the bit lines 12 to the sense amplifiers 14 and the reference circuits 46. Multiplexing circuit 40 makes it possible to select which of a group of bit lines is coupled to the signal input of a sense amplifier 14. When a bit line 12 is coupled to a sense amplifier 14 its neighboring bit lines 12 are coupled to the reference circuit 46 for that sense amplifier. Although an example has been shown wherein groups of two bit lines 12 are associated with a differential sense amplifier 14, it should be appreciated that larger groups can be used. In this case there will be more than one intermediate bit line 12 between bit lines that are coupled to signal inputs of sense amplifiers. In this case second multiplexing circuits 42 are configured to that selected ones of these intermediate bit lines 12 are coupled to reference circuits 16 for differential sense amplifiers 14 that are connected to bit lines 12 on respective sides of the intermediate bit lines.

Although embodiments have been shown wherein bit lines 12 are coupled continuously to a differential sense amplifier 14 and a core reference circuit 16 during sensing, it should be appreciated that instead a temporary coupling may be used. For example, the bit lines may be coupled to differential sense amplifier 14 and core reference circuit 16 up to the end of a sampling time interval, after which the coupling may be interrupted. As long as the couplings to the differential sense amplifier 14 and the core reference circuit 16 are interrupted at the same time the variation on the bit lines 12 will affect the signal input and the reference input of the differential sense amplifier in the same way. Therefore at least part of the amplification may take place after the interruption. In another embodiment the differential sense amplifier 14 may be activated only after the interruption.

The invention claimed is:

1. An electronic circuit comprising
 a memory matrix with a plurality of columns of memory cells and bit lines coupled to the memory cells in respective ones of the columns;
 a reference circuit with a reference output;
 a differential sense amplifier with a first and second input;
 a circuit for coupling the first input of the differential sense amplifier at least to a first one of the bit lines and the second input of the differential sense amplifier to the reference output; and
 a cross-coupling circuit, configured to couple at least a second one of the bit lines, which is adjacent to the first one of the bit lines, to the reference circuit, so that a bit line signal value on the second one of the bit lines will affect a reference signal value on the reference output, at least partly reproducing an effect of crosstalk of the bit line signal value on the second one of the bit lines on a bit line signal value on the first one of the bit lines.

2. An electronic circuit according to claim 1, wherein the cross-coupling circuit is configured to couple a plurality of second ones of the bit lines, which are adjacent on mutually opposite sides to the first one of the bit lines, to the reference circuit, so that bit line signal values on each second one of the bit lines affects the reference signal value on the reference output.

3. An electronic circuit according to claim 1, wherein the cross-coupling circuit and/or the reference circuit is configured so that an effect of the bit line signal value on the second one of the bit lines on the reference signal value on the reference output is equal in size to an effect of the bit line signal value on the second one of the bit lines on a bit line signal value on the first one of the bit lines.

4. An electronic circuit according to claim 1, wherein the reference circuit comprises a resistive element coupled between the second one of the bit lines and the reference output.

5. An electronic circuit according to claim 4, wherein the reference circuit comprises a current source circuit with a current output coupled to the reference output.

6. An electronic circuit according to claim 1, wherein the memory matrix comprises non-volatile memory cells coupled to the bit lines.

7. An electronic circuit according to claim 1, comprising a detection circuit for determining in which of more than two signal ranges a signal on the first one of the bit lines lies, the detection circuit comprising the differential sense amplifier at least for distinguishing between signals in an adjacent pair of the ranges.

8. An electronic circuit according to claim 1, wherein the memory matrix comprises a plurality of columns of memory cells, each bit line corresponding to a respective column, the electronic circuit comprising a respective reference circuit, a respective differential sense amplifier and a respective cross-coupling circuit for each column, each bit line that corresponds to a particular column being coupled to a first input of the differential sense amplifier for the particular column, the reference circuit for the particular column being coupled to a second input of the differential sense amplifier for the particular column, the cross coupling circuit for the particular column coupling at least the bit line for a further column, which is adjacent to the particular column, to the reference circuit, so that a bit line signal value on the bit line for the further column affects a reference signal value on the reference output of the reference circuit for the particular column.

9. An electronic circuit according to claim 1, wherein the matrix comprises a plurality of groups of columns of memory cells, each bit line corresponding to a respective column, the electronic circuit comprising multiplexing circuits, a respective reference circuit, a respective differential sense amplifier and a respective cross-coupling circuit for each group of columns, the bit lines that correspond to columns in the particular group being coupled to a first input of the differential sense amplifier for the particular group via the multiplexing circuits, the bit lines of columns that are adjacent to any column in the particular group being coupled to the reference circuit for the particular group via the multiplexing circuits, the reference circuit for the particular group being coupled to a second input of the differential sense amplifier for the particular group, the multiplexing circuits being configured to couple selectable ones of the bit lines of the group to the first input of the differential sense amplifier while coupling at least one adjacent bit lines of the selected one of the bit lines to the reference circuit for the particular group.

10. A method of reading data from a memory matrix with a plurality of bit lines, the method comprising
 providing a differential sense amplifier with a first and second input;
 supplying a signal derived from a first one of the bit lines to the first input;
 supplying a reference signal from a reference output of a reference circuit to the second input; and
 coupling at least a second one of the bit lines, which is adjacent to the first one of the bit lines, to the reference circuit, so that a bit line signal value on the second one of the bit lines affects a reference signal value on the reference output, at least partly reproducing an effect of crosstalk of the bit line signal value on the second one of the bit lines on a bit line signal value on the first one of the bit lines.

* * * * *